United States Patent
Wen et al.

(10) Patent No.: US 10,930,893 B2
(45) Date of Patent: Feb. 23, 2021

(54) ORGANIC LIGHT-EMITTING DIODE DEVICE, MANUFACTURING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Guanyin Wen, Beijing (CN); Lei Chen, Beijing (CN); Haidong Wu, Beijing (CN); Na Li, Beijing (CN)

(73) Assignees: BOE TECHNOLOGY GROUP CO., LTD., Beijing (CN); ORDOS YUANSHENG OPTOELECTRONICS CO., LTD., Ordos Inner Mongolia (CN)

( * ) Notice: Subject to any disclaimer, the term of this patent is extended or adjusted under 35 U.S.C. 154(b) by 359 days.

(21) Appl. No.: 15/751,703

(22) PCT Filed: Aug. 15, 2017

(86) PCT No.: PCT/CN2017/097523
§ 371 (c)(1),
(2) Date: Feb. 9, 2018

(87) PCT Pub. No.: WO2018/149103
PCT Pub. Date: Aug. 23, 2018

(65) Prior Publication Data
US 2020/0220112 A1    Jul. 9, 2020

(30) Foreign Application Priority Data
Feb. 14, 2017 (CN) .......................... 201710078837.1

(51) Int. Cl.
*H01L 51/52* (2006.01)
*H01L 51/56* (2006.01)

(52) U.S. Cl.
CPC .......... *H01L 51/5284* (2013.01); *H01L 51/56* (2013.01); *H01L 2251/533* (2013.01); *H01L 2251/5315* (2013.01)

(58) Field of Classification Search
CPC ................. H01L 51/5284; H01L 51/56; H01L 2251/5315; H01L 2251/533
See application file for complete search history.

(56) References Cited

U.S. PATENT DOCUMENTS

2007/0182314 A1    8/2007 Oh et al.
2009/0021157 A1    1/2009 Kim et al.
(Continued)

FOREIGN PATENT DOCUMENTS

CN     1732714 A    2/2006
CN     101212023 A  7/2008
(Continued)

OTHER PUBLICATIONS

First CN Office Action for CN Appl. No. 2017100788837.1, dated Feb. 26, 2018.
(Continued)

*Primary Examiner* — Marc Anthony Armand
(74) *Attorney, Agent, or Firm* — Dinsmore & Shohl LLP

(57) ABSTRACT

The present disclosure discloses an organic light-emitting diode device, a manufacturing method thereof and a display device. The organic light-emitting diode device comprises: a substrate (100); an organic light-emitting diode layer (200) on a side of the substrate (100); and a barrier layer (510) configured to block ultraviolet rays from entering the organic light-emitting diode layer, wherein the barrier layer is on a side of the organic light-emitting diode layer away (Continued)

from the substrate or on a side of the organic light-emitting diode layer close to the substrate. The organic light-emitting diode device can solve the technical problem of short service life due to the influence of ultraviolet rays in the sunlight.

15 Claims, 2 Drawing Sheets

(56) References Cited

U.S. PATENT DOCUMENTS

| | | | |
|---|---|---|---|
| 2009/0218939 | A1 | 9/2009 | Shitagaki et al. |
| 2011/0127498 | A1 | 6/2011 | Jung et al. |
| 2011/0132449 | A1 | 6/2011 | Ramadas et al. |
| 2012/0211078 | A1 | 8/2012 | Kato et al. |
| 2013/0140982 | A1 | 6/2013 | Park |
| 2014/0042422 | A1 | 2/2014 | Silverman et al. |
| 2014/0179040 | A1* | 6/2014 | Ramadas ............ B32B 27/20 438/27 |
| 2014/0264316 | A1 | 9/2014 | Setz et al. |
| 2015/0053951 | A1 | 2/2015 | Riegel et al. |
| 2015/0097165 | A1* | 4/2015 | Setz ..................... C03C 8/20 257/40 |
| 2016/0126302 | A1 | 5/2016 | Cheng et al. |
| 2016/0190222 | A1 | 6/2016 | Chen et al. |
| 2018/0122865 | A1 | 5/2018 | Liu |

FOREIGN PATENT DOCUMENTS

| | | | |
|---|---|---|---|
| CN | 101431842 | A | 5/2009 |
| CN | 102057750 | A | 5/2011 |
| CN | 103931010 | A | 7/2014 |
| CN | 104040750 | A | 9/2014 |
| CN | 104205404 | A | 12/2014 |
| CN | 104300085 | A | 1/2015 |
| CN | 104379521 | A | 2/2015 |
| CN | 105118393 | A | 12/2015 |
| CN | 106229420 | A | 12/2016 |
| CN | 106356394 | A | 1/2017 |
| CN | 106876604 | A | 6/2017 |
| JP | 2008218423 | A | 9/2008 |

OTHER PUBLICATIONS

International Search Report and Written Opinion for International Appl. No. PCT/CN2017/097523, dated Nov. 22, 2017.
Second CN Office Action for CN Appl. No. 201710078837.1, dated Oct. 31, 2018.
First Office Action for IN Patent Application No. 201837004974 dated Nov. 16, 2020.
Extended European search report for European Patent Application No. EP17835993.1, dated Dec. 3, 2020.
Won Min Yun. 'Thermally Evaporated SiO Thin Films As a Versatile Interlayer for Plasma-Based OLED Passivation'. Applied Materials & Interfaces, vol. 4, No. 6, pages 3247-3253, Jun. 8, 2012.

* cited by examiner

ORGANIC LIGHT-EMITTING DIODE DEVICE, MANUFACTURING METHOD THEREOF, AND DISPLAY DEVICE

CROSS REFERENCE TO RELATED APPLICATIONS

This application is a U.S. National Stage under 35 U.S.C. § 371 of PCT/CN2017/097523, filed on Aug. 15, 2017, which claims priority to Chinese Application No. 201710078837.1 filed on Feb. 14, 2017, the disclosure of which is hereby incorporated by reference in its entirety as a part of this application.

TECHNICAL FIELD

Embodiments of the present disclosure relate to an organic light-emitting diode device, a manufacturing method thereof and a display device.

BACKGROUND

The organic light-emitting diode device comprises a substrate, and an organic light-emitting diode layer, a capping layer and a packaging layer arranged in this order on the substrate. As the sunlight contains a lot of ultraviolet rays, the ultraviolet rays in the sunlight will cause a oxidation-reduction reaction and thus deterioration with respect to the organic light-emitting material in the organic light emitting diode, thereby greatly reducing the service life of the organic light-emitting diode device.

SUMMARY

The first through fourth embodiments of the present disclosure provide an organic light-emitting diode device comprising: a substrate; an organic light-emitting diode layer on a side of the substrate; and a barrier layer configured to block ultraviolet rays from entering the organic light-emitting diode layer.

The barrier layer is on a side of the organic light-emitting diode layer away from the substrate or on a side of the organic light-emitting diode layer close to the substrate.

For example, the organic light-emitting diode device is a top light-emitting structure, wherein the barrier layer is on the side of the organic light-emitting diode layer away from the substrate.

For example, the organic light-emitting diode device is a bottom light-emitting structure, wherein the barrier layer is on the side of the organic light-emitting diode layer close to the substrate.

For example, the barrier layer is an organic material layer or an inorganic material layer. For example, the barrier layer includes at least one of an ultraviolet absorber or an ultraviolet reflecting agent.

For example, the barrier layer is at least one of a capping layer for capping the electrode, a light extraction layer or a packaging layer.

For example, the ultraviolet absorber comprises one or a combination of the following: salicylates, benzophenones, benzotriazoles, substituted acrylonitriles, triazines and hindered amines.

For example, the ultraviolet reflecting agent comprises one or a combination of the following: titanium dioxide, zinc oxide, talc powder, clay, calcium carbonate.

The fifth embodiment of the disclosure provides a display device comprising the organic light-emitting diode device as stated above.

An embodiment of the present disclosure provides a method of manufacturing an organic light-emitting diode device, comprising: forming an organic light-emitting diode layer on a side of the substrate and forming a barrier layer on a side of the organic light-emitting diode layer away from the substrate or on a side of the organic light-emitting diode layer close to the substrate.

For example, the barrier layer is formed on the substrate before forming the organic light-emitting diode layer, and then the organic light-emitting diode layer is formed on the barrier layer, wherein the barrier layer is on the side of the organic light-emitting diode layer close to the substrate.

For example, forming a barrier layer on a side of the organic light-emitting diode layer away from the substrate or on a side of the organic light-emitting diode layer close to the substrate comprises:

forming a material layer comprising at least one of an ultraviolet absorber or an ultraviolet reflecting agent.

For example, the barrier layer is a layer structure capable of absorbing and/or reflecting ultraviolet rays, and a manufacturing method of the barrier layer comprises: forming the ultraviolet absorber into the layer structure capable of absorbing the ultraviolet rays.

For example, forming a barrier layer on a side of the organic light-emitting diode layer away from the substrate or on a side of the organic light-emitting diode layer close to the substrate comprises:

mixing at least one of the ultraviolet absorber or the ultraviolet reflecting agent with an organic material to form the barrier layer. For example, mixing at least one of the ultraviolet absorber or the ultraviolet reflecting agent with an organic material comprises: mixing at least one of a capping layer material for capping the electrode, a light extraction layer material or a packaging layer material with at least one of the ultraviolet absorber or the ultraviolet reflecting agent to form the barrier layer.

For example, forming a barrier layer on a side of the organic light-emitting diode layer away from the substrate or on a side of the organic light-emitting diode layer close to the substrate comprises mixing at least one of the ultraviolet absorber or the ultraviolet reflecting agent with an inorganic material to form the barrier layer.

For example, mixing at least one of the ultraviolet absorber or the ultraviolet reflecting agent with an inorganic material comprises: mixing at least one of a capping layer for capping the electrode, a light extraction layer or a packaging layer with at least one of the ultraviolet absorber or the ultraviolet reflecting agent to form the barrier layer.

BRIEF DESCRIPTION OF THE DRAWINGS

To describe the technical solutions in the embodiments of the present disclosure more clearly, the accompanying drawings used in the description of the embodiments are briefly introduced in the following. Evidently, the accompanying drawings are only some embodiments of the present disclosure, but are not limitations to the present disclosure.

DETAILED DESCRIPTION

Figure 1:
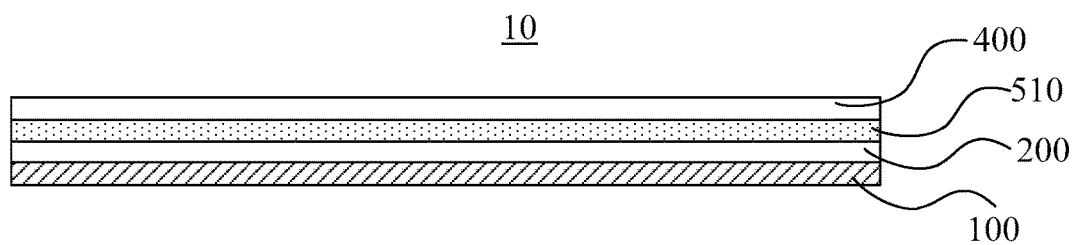
FIG. 1 is a schematic diagram showing an organic light-emitting diode device according to a first embodiment of the present disclosure.

In order to make the objectives, technical solutions, and advantages of the embodiments of the present disclosure more clear, the technical solutions in the embodiments of the present disclosure are clearly and completely described in the following with reference to the accompanying drawings in the embodiments of the present disclosure. Evidently, the embodiments in the following description are only a part rather than all of the embodiments of the present disclosure. Based on the embodiments of the present disclosure, all other embodiments obtained by persons of ordinary skill in the art without creative effects shall fall within the protection scope of the present disclosure.

The organic light-emitting diode device according to the embodiments of the present disclosure, as shown in FIG. 1, FIG. 2, FIG. 3, and FIG. 4, comprises: a substrate 100; an organic light-emitting diode layer 200 on a side of the substrate; and a barrier layer 510 on a side of the organic light-emitting diode layer away from or close to the substrate. The organic light-emitting diode Layer 200 has an organic light-emitting diode which can be used for emitting light rays with a required color, e.g., red light, green light, blue light, or white light, wherein the barrier layer is configured to block ultraviolet rays from entering the organic light-emitting diode layer.

For example, the organic light-emitting diode device may be a top light-emitting structure, then the barrier layer 510 is on the side of the organic light-emitting diode layer away from the substrate, and accordingly the barrier layer is also on the side of the organic light-emitting diode layer away from the substrate.

For example, the organic light-emitting diode device may be a bottom light-emitting structure, then the barrier layer 510 is on the side of the organic light-emitting diode layer close to the substrate, and accordingly the barrier layer is also on the side of the organic light-emitting diode layer close to the substrate.

The organic light-emitting diode device according to the embodiments comprises: a substrate; an organic light-emitting diode layer on a side of the substrate; and a barrier layer on a light exit side of the organic light-emitting diode layer (e.g., a side of the organic light-emitting diode layer away from the substrate or close to the substrate). When the sunlight irradiates the organic light-emitting diode device from the light exit side, ultraviolet rays in the sunlight will be shielded by the barrier layer, which greatly reduces the influence of the ultraviolet rays with respect to the organic light-emitting material in the organic light-emitting diode, thereby greatly reducing the influence of the ultraviolet rays with respect to the organic light-emitting diode device and extending the service life of the organic light-emitting diode device.

The method of manufacturing an organic light-emitting diode device according to the embodiments comprises the steps of: forming an organic light-emitting diode layer on a side of a substrate and forming a barrier layer on a side of the organic light-emitting diode layer away from the substrate or on a side of the organic light-emitting diode layer close to the substrate. The barrier layer is configured to block ultraviolet rays from entering the organic light-emitting diode layer. The organic light-emitting diode layer has an organic light-emitting diode.

For example, the barrier layer is formed on the substrate before forming the organic light-emitting diode layer, and then the organic light-emitting diode layer is formed on the barrier layer, wherein the barrier layer is on the side of the organic light-emitting diode layer close to the substrate.

By using the above manufacturing method, the organic light-emitting diode device with the barrier layer can be manufactured conveniently, and the manufacturing method is simple and easy to realize.

In order to achieve the function of shielding ultraviolet rays, the material for forming the barrier layer is required to include ultraviolet shielding agent. The ultraviolet shielding agent refers to a substance capable of reflecting or absorbing the ultraviolet rays, which can shield ultraviolet light waves and reduce the transmission of the ultraviolet rays. There are two kinds of ultraviolet shielding agent, wherein one is an organic ultraviolet shielding agent (e.g., ultraviolet absorber), and the other is an inorganic ultraviolet shielding agent (e.g., ultraviolet reflecting agent). The ultraviolet absorber refers to an organic compound capable of absorbing the ultraviolet light with a wavelength of 270-400 nm and comprises one or a combination of the following: salicylates, benzophenones, benzotriazoles, substituted acrylonitriles, triazines and hindered amines. A common feature of such organic compounds is that they comprise an alkyl group in structure, and in the process of forming stable hydrogen bonds, hydrogen bond chelate rings and etc., they can absorb energy which is converted into heat to be dissipated. The main principle of the ultraviolet reflecting agent is to reflect the ultraviolet rays, and the ultraviolet reflecting agent mostly is a metal oxide or ceramic powder, for example, comprising one or a combination of the following: titanium dioxide, zinc oxide, talc powder, clay, calcium carbonate, and etc. They all have a higher refractive index, can increase reflection and scattering with respect to the ultraviolet rays.

For the structure of the barrier layer, for example, it can be a separately provided layer structure formed by the ultraviolet absorber, capable of absorbing the ultraviolet rays, wherein the layer structure formed by the ultraviolet absorber, capable of absorbing the ultraviolet rays, is a layer structure formed by an organic ultraviolet shielding agent, i.e., the ultraviolet absorber, capable of absorbing the ultraviolet rays. The separately provided layer structure formed by the ultraviolet absorber, capable of absorbing the ultraviolet rays, through shielding the ultraviolet rays by absorbing the ultraviolet rays, greatly reduces the influence of the ultraviolet rays with respect to the organic light-emitting material in the organic light-emitting diode, thereby greatly reducing the effect of the ultraviolet rays with respect to the organic light-emitting diode device and extending the service life of the organic light-emitting diode device.

For example, the separately provided layer structure formed by the ultraviolet absorber, capable of absorbing the ultraviolet rays, comprises: a layer structure capable of absorbing the ultraviolet rays solely formed by the ultraviolet absorber.

The step of manufacturing the layer structure capable of absorbing the ultraviolet rays solely formed by the ultraviolet absorber does not affect other steps of the method of manufacturing the organic light-emitting diode device, and is simple and easy to be realized.

Figure 2:
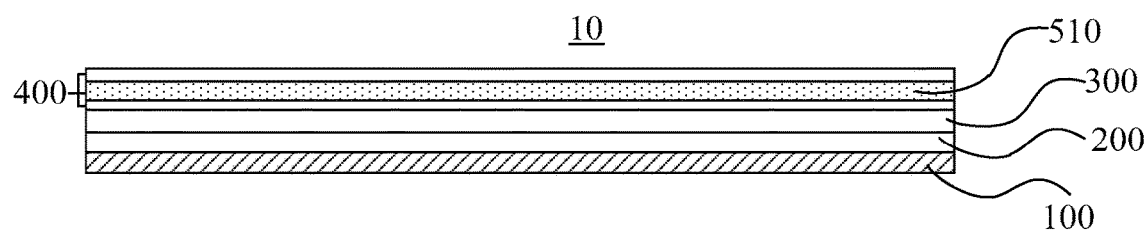
FIG. 2 is a schematic diagram showing an organic light-emitting diode device according to a second embodiment of the present disclosure.

For the structure of the barrier layer, for example, as shown in FIG. 1 and FIG. 2, it can be a layer structure capable of absorbing the ultraviolet rays formed by the ultraviolet absorber and an organic material, or a layer structure capable of absorbing the ultraviolet rays formed by the ultraviolet absorber and an inorganic material. The layer structure capable of absorbing the ultraviolet rays formed by the ultraviolet absorber and an organic material, on the one hand, has a function of absorbing ultraviolet rays, and on the other hand, has a function of an organic layer formed by the organic material. In this way, a one-layer structure achieves two functions at the same time, and the structure of the organic light-emitting diode device is simpler. Likewise, the layer structure capable of absorbing the ultraviolet rays formed by the ultraviolet absorber and an inorganic material, on the one hand, has a function of absorbing ultraviolet rays, and on the other hand, has a function of an inorganic layer formed by the inorganic material. In this way, a one-layer structure achieves two functions at the same time, and the structure of the organic light-emitting diode device is simpler.

For example, a method of manufacturing a layer structure capable of absorbing the ultraviolet rays formed by the ultraviolet absorber and an organic material comprises: mixing the ultraviolet absorber with the organic material to form the layer structure capable of absorbing the ultraviolet rays.

In the process of manufacturing the organic light-emitting diode device, steps for forming various organic layer structures are required, and by mixing the ultraviolet absorber with the organic material when forming the organic layer structures to form the layer structure capable of absorbing the ultraviolet rays, the method of manufacturing the organic light-emitting diode device has fewer steps added, is simpler and easy to be realized.

For example, a method of manufacturing a layer structure capable of absorbing the ultraviolet rays formed by the ultraviolet absorber and an inorganic material comprises: mixing the ultraviolet absorber with the inorganic material to form the layer structure capable of absorbing the ultraviolet rays.

In the process of manufacturing the organic light-emitting diode device, steps for forming various inorganic layer structures are required, and by mixing the ultraviolet absorber with the inorganic material when forming the inorganic layer structures to form the layer structure capable of absorbing the ultraviolet rays, the method of manufacturing the organic light-emitting diode device has fewer steps added, is simpler and easy to be realized.

Likewise, a barrier layer capable of reflecting the ultraviolet rays solely formed by the ultraviolet reflecting agent, or a barrier layer capable of reflecting the ultraviolet rays formed by the ultraviolet reflecting agent and an organic material or inorganic material, can be also formed, which is not described here.

The first through third embodiments of the present disclosure give detailed descriptions in which the organic light-emitting diode device is a top light-emitting structure.

For a specific structure of the barrier layer capable of absorbing the ultraviolet rays formed by the ultraviolet absorber and an organic material, it may be at least one of a capping layer for capping the electrode, a light extraction layer or a packaging layer. For example, as shown in FIG. 1, FIG. 1 is a schematic diagram showing an organic light-emitting diode device 10 according to a first embodiment of the present disclosure, wherein the barrier layer 510 is a capping layer capable of absorbing the ultraviolet rays formed by the ultraviolet absorber and a material for forming the capping layer, wherein the capping layer capable of absorbing the ultraviolet rays has a function of capping the electrode, and another function of shielding the ultraviolet rays. The organic light-emitting diode device as shown in FIG. 1 further comprises a packaging layer 400 formed on a side of the capping layer capable of absorbing the ultraviolet rays away from the substrate. It should be noted that, the material for forming the capping layer may adopt an organic material for forming the capping layer, or an inorganic material for forming the capping layer.

It should be further noted that, the organic material or inorganic material in the layer structure capable of absorbing the ultraviolet rays formed by the ultraviolet absorber and the organic material or by the ultraviolet absorber and the inorganic material is not limited to the material for forming the capping layer, and it may be a material in the organic light-emitting diode device for forming other layer structures on a side of the organic light-emitting diode layer away from or close to the substrate. For example, it may be an organic material or inorganic material for forming the light extraction layer, or it may be an organic material or inorganic material for forming functional layers having functions of electrode capping and light extraction.

The barrier layer may be a packaging layer capable of absorbing the ultraviolet rays formed by the ultraviolet absorber and the material for forming the packaging layer. It should be noted that, the packaging layer may be a single-layer layer structure, or may be a laminated multi-layer layer structure, as long as one layer of the layer structure in the packaging layer is formed by the ultraviolet absorber and the material for forming the layer of the layer structure. For example, as shown in FIG. 2, FIG. 2 is a schematic diagram showing an organic light-emitting diode device 10 according to a second embodiment of the present disclosure, wherein the packaging layer comprises a laminated three-layer structure, and the barrier layer 510 is an intermediate layer and is a packaging layer structure capable of absorbing the ultraviolet rays formed by the ultraviolet absorber and polymer ink inkjet print, that is, the packaging layer structure capable of absorbing the ultraviolet rays has both the functions of shielding the ultraviolet rays and packaging. The organic light-emitting diode device as shown in FIG. 2 further comprises a capping layer 300 between the organic light-emitting diode layer 200 and the packaging layer 400. It should be noted that, the material for forming the packaging layer not only can comprise the polymer ink, but also can comprise other organic materials for forming the packaging layer and inorganic materials for forming the packaging layer.

With regard to the amount of the ultraviolet absorber in the barrier layer, the proportion of the ultraviolet absorber is any value between 0.5%-1%. The proportion can be specifically selected based on a different requirement of the organic light-emitting diode device for shielding the ultraviolet rays.

When the barrier layer is a capping layer capable of absorbing the ultraviolet rays formed by the ultraviolet absorber and the organic material for forming the capping layer for capping the electrode, the method of manufacturing the barrier layer comprises the following step.

The ultraviolet absorber and the organic material for forming the capping layer are mixed and vapor-plated, and by effectively utilizing the vapor plating process required to form the capping layer, the capping layer capable of absorbing the ultraviolet rays is formed. It should be noted that, the vapor plating is one of processes for forming the capping layer, and is not limited to the vapor plating process, as long as the capping layer capable of absorbing the ultraviolet rays can be formed. It should be further noted that, the material for forming the capping layer can adopt the organic material for forming the capping layer or inorganic material for forming the capping layer.

It should be further noted that, the organic material or inorganic material in the layer structure capable of absorbing the ultraviolet rays formed by the ultraviolet absorber and the organic material or by the ultraviolet absorber and the inorganic material, is not limited to the material for forming the capping layer, and it may be a material in the organic light-emitting diode device for forming other layer structures on a side of the organic light-emitting diode layer away from or close to the substrate. For example, it may be an organic material or inorganic material for forming the light extraction layer, or it may be an organic material or inorganic material for forming functional layers having functions of electrode capping and light extraction. At least one of a capping layer material for capping the electrode, a light extraction layer material or a packaging layer material can be mixed with the ultraviolet absorber to form the barrier layer.

For example, the proportion of the ultraviolet absorber in the mixture is any value between 0.5%-1%.

In this way, the capping layer further has a function of shielding the ultraviolet rays, and the manufacturing method thereof is simpler and more convenient. It should be noted that, the material for forming the capping layer can adopt the organic material for forming the capping layer or inorganic material for forming the capping layer.

It should be further noted that, the organic material or inorganic material in the layer structure capable of absorbing the ultraviolet rays formed by the ultraviolet absorber and the organic material or by the ultraviolet absorber and the inorganic material is not limited to the material for forming the capping layer, and it may be a material for forming other layer structures on a side of the organic light-emitting diode layer away from or close to the substrate in the organic light-emitting diode device. For example, it may be an organic material or inorganic material for forming the light extraction layer, or it may be an organic material or inorganic material for forming functional layers having functions of electrode capping and light extraction.

When the barrier layer is a packaging layer capable of absorbing the ultraviolet rays formed by the ultraviolet absorber and the material for forming the packaging layer, the method of manufacturing the barrier layer comprises the following step.

The ultraviolet absorber and the material for forming the packaging layer are mixed to form the packaging layer capable of absorbing the ultraviolet rays.

It should be noted that, the packaging layer may be a single-layer layer structure, or may be a laminated multi-layer layer structure, as long as one layer of the layer structure in the packaging layer is formed by the ultraviolet absorber and the material for forming the layer of the layer structure. For example, as shown in FIG. 2, the packaging layer comprises a laminated three-layer structure, and the intermediate layer is a packaging layer structure capable of absorbing the ultraviolet rays 510 formed by the ultraviolet absorber and polymer ink inkjet print, that is, the packaging layer structure capable of absorbing the ultraviolet rays has both the functions of shielding the ultraviolet rays and packaging. The organic light-emitting diode device as shown in FIG. 2 further comprises a capping layer 300 between the organic light-emitting diode layer 200 and the packaging layer 400. It should be noted that, the material for forming the packaging layer not only can comprise the polymer ink, but also can comprise other organic materials for forming the packaging layer and inorganic materials for forming the packaging layer.

When the barrier layer is a capping layer capable of absorbing the ultraviolet rays formed by the ultraviolet absorber and the organic material for forming the capping layer, the thickness of the capping layer capable of absorbing the ultraviolet rays is any value between 50-80 nm. In this way, the capping layer capable of absorbing the ultraviolet rays not only has the capping function of the capping layer, but also has the function of shielding the ultraviolet rays.

Figure 3:
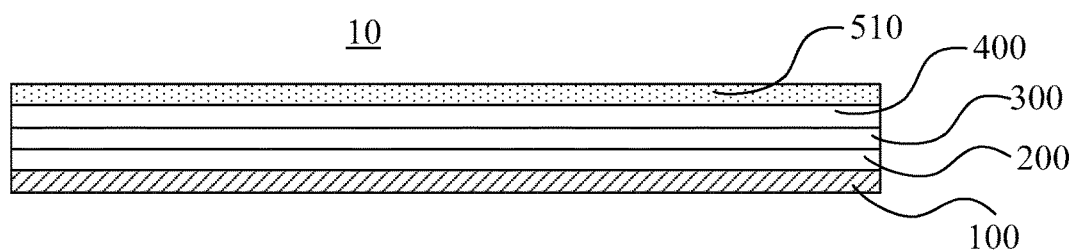
FIG. 3 is a schematic diagram showing an organic light-emitting diode device according to a third embodiment of the present disclosure.

With regard to the illustrative structure of the barrier layer, as shown in FIG. 3, FIG. 3 is a schematic diagram showing an organic light-emitting diode device 10 according to a third embodiment of the present disclosure, wherein the barrier layer 510 may be also a separately provided layer structure capable of reflecting the ultraviolet rays formed by the ultraviolet reflecting agent.

The separately provided layer structure capable of reflecting the ultraviolet rays formed by the ultraviolet reflecting agent, through shielding the ultraviolet rays by reflecting the ultraviolet rays, greatly reduces the influence of the ultraviolet rays with respect to the organic light-emitting material in the organic light-emitting diode. The organic light-emitting diode device 10 as shown in FIG. 3 further comprises a capping layer 300 and a packaging layer 400 between the organic light-emitting diode layer 200 and the barrier layer 510.

For example, the ultraviolet reflecting agent in the layer structure capable of reflecting the ultraviolet rays formed by the ultraviolet reflecting agent may be titanium dioxide or zinc oxide, because it has a higher refractive index, can increase refractions and reflections of the surface of the organic light-emitting diode device with respect to the ultraviolet rays, and thereby greatly reduces the contact of the ultraviolet rays with the organic light-emitting material in the organic light-emitting diode.

In the aforementioned methods of manufacturing various layer structures, the ultraviolet absorber can be replaced by the ultraviolet reflecting agent or a mixture of the ultraviolet absorber and reflecting agent, and a layer structure capable of absorbing and/or reflecting the ultraviolet rays can be formed by using a similar manufacturing method.

For example, the method of manufacturing the separately provided layer structure capable of reflecting the ultraviolet rays formed by the ultraviolet reflecting agent comprises: forming the ultraviolet reflecting agent into the layer structure capable of reflecting the ultraviolet rays.

The separately provided layer structure capable of reflecting the ultraviolet rays formed by the ultraviolet reflecting agent does not affect other steps of the method of manufacturing the organic light-emitting diode device, and is simply manufactured and conveniently realized.

When the barrier layer is a layer structure capable of reflecting the ultraviolet rays formed by the ultraviolet reflecting agent, the thickness of the layer structure capable of reflecting the ultraviolet rays is any value between 50-100 nm. The layer structure capable of reflecting the ultraviolet rays with such a thickness can reflect most of the ultraviolet rays in the sunlight.

The organic light-emitting diode device, for example, can be a passive or active drive mode, so it can include a driving circuit and etc. For example, for the active drive mode, an array circuit layer can be formed on the substrate, including circuit elements such as switching transistors, driving transistors, storage capacitors. Other structures involved in the embodiments are not described here.

Still further, the layer structure capable of reflecting the ultraviolet rays is on a side of the organic light-emitting diode device towards the outside. In this way, the ultraviolet rays in the sunlight will be reflected on the side of the organic light-emitting diode device towards the outside, and the ultraviolet rays will not or most of them will not enter the organic light-emitting diode device, which greatly reduces the influence of the ultraviolet rays with respect to the organic light-emitting material in the organic light-emitting diode.

Figure 4:
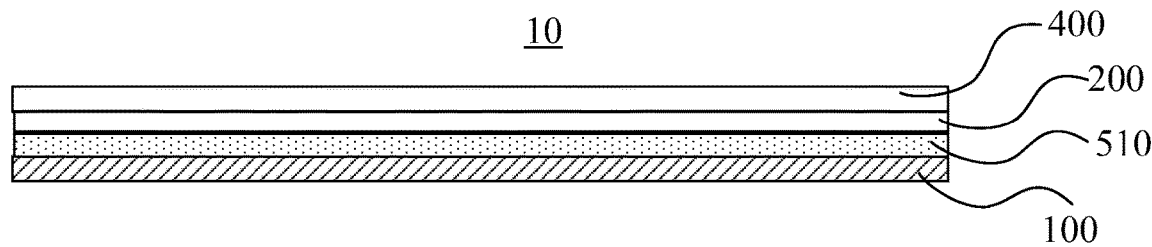
FIG. 4 is a schematic diagram showing an organic light-emitting diode device according to a fourth embodiment of the present disclosure.

The above descriptions all are based on the example in which the organic light-emitting diode device is a top light-emitting structure. However, it can be understood that the organic light-emitting diode device can also be a bottom light-emitting structure. By referring to FIG. 4, FIG. 4 is a schematic diagram showing an organic light-emitting diode device 10 according to the fourth embodiment of the present disclosure. The barrier layer 510 is on the side of the organic light-emitting diode layer close to the substrate. The various layer structures in the organic light-emitting diode device for the top light-emitting structure and manufacturing methods thereof are also applicable to the organic light-emitting diode device 10 for the bottom light-emitting structure, and they are not described here.

Figure 5:
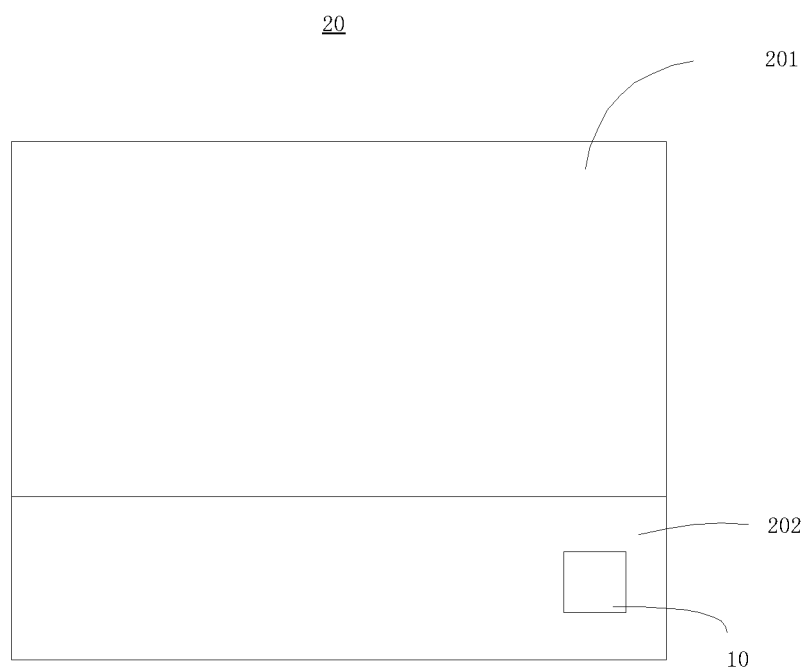
FIG. 5 is a schematic diagram showing a structure of a display device according to a fifth embodiment of the present disclosure.

The fifth embodiment of the present disclosure provides a display device including the aforementioned organic light-emitting diode device. For example, by referring to FIG. 5, the display device 20 is a liquid crystal display, comprising a display panel 201 and a backlight module 202. The backlight module 202 comprises the organic light-emitting diode device 10, and the organic light-emitting diode device 10, as a backlight source for the liquid crystal display, provides backlight for the display panel 201 to achieve the display function.

The above embodiments merely are illustrative embodiments of the present disclosure, and they are not intended to limit the scope of protection of the present disclosure, and the scope of protection of the present disclosure is determined only by the accompanying claims.

What is claimed is:

1. An organic light-emitting diode device comprising:
    a substrate;
    an organic light-emitting diode layer on a side of the substrate; and
    a barrier layer configured to block ultraviolet rays from entering the organic light-emitting diode layer,
    wherein the barrier layer is on a side of the organic light-emitting diode layer away from the substrate or on a side of the organic light-emitting diode layer close to the substrate,
    wherein the barrier layer is at least one of:
        a capping layer for capping an electrode, wherein the capping layer is capable of absorbing ultraviolet rays,
        a light extraction layer for light extraction, wherein the light extraction layer is capable of electrode capping and absorbing ultraviolet rays, or
        a packaging layer for packaging, wherein the packaging layer is capable of absorbing ultraviolet rays and capping the electrode and the light extraction layer;
    wherein the barrier layer is formed by a mixture of ultraviolet absorber and organic material or a mixture of ultraviolet absorber and inorganic material; and
    wherein the proportion of the ultraviolet absorber in the mixture is any value between 0.5%-1%.

2. The organic light-emitting diode device according to claim 1, wherein the barrier layer further includes an ultraviolet reflecting agent.

3. The organic light-emitting diode device according to claim 1, wherein the barrier layer is on the side of the organic light-emitting diode layer away from the substrate.

4. The organic light-emitting diode device according to claim 1, wherein the barrier layer is on the side of the organic light-emitting diode layer away from the substrate.

5. The organic light-emitting diode device according to claim 1, wherein the organic light-emitting diode device is a top light-emitting structure, and the barrier layer is on the side of the organic light-emitting diode layer away from the substrate.

6. The organic light-emitting diode device according to claim 1, wherein the organic light-emitting diode device is a bottom light-emitting structure, and the barrier layer is on the side of the organic light-emitting diode layer close to the substrate.

7. The organic light-emitting diode device according to claim 1, wherein the ultraviolet absorber comprises one or a combination of the following: salicylates, benzophenones, benzotriazoles, substituted acrylonitriles, triazines and hindered amines.

8. The organic light-emitting diode device according to claim 2, wherein the ultraviolet reflecting agent comprises one or a combination of the following: titanium dioxide, zinc oxide, talc powder, clay, calcium carbonate.

9. A display device comprising the organic light-emitting diode device according to claim 1.

10. A method of manufacturing an organic light-emitting diode device, comprising:
    forming an organic light-emitting diode layer on a side of a substrate; and
    forming a barrier layer on a side of the organic light-emitting diode layer away from the substrate or on a side of the organic light-emitting diode layer close to the substrate, wherein the barrier layer is configured to block ultraviolet rays from entering the organic light-emitting diode layer,
    wherein the barrier layer is at least one of:
        a capping layer for capping an electrode, wherein the capping layer is capable of absorbing ultraviolet rays,
        a light extraction layer for light extraction, wherein the light extraction layer is capable of electrode capping and absorbing ultraviolet rays, or
        a packaging layer for packaging, wherein the packaging layer is capable of absorbing ultraviolet rays and capping the electrode and the light extraction layer;
    wherein forming the barrier comprises mixing ultraviolet absorber and organic material or mixing ultraviolet absorber and inorganic material; and
    wherein the proportion of the ultraviolet absorber in the mixture is any value between 0.5%-1%.

11. The method of manufacturing an organic light-emitting diode device according to claim 10, wherein the barrier layer is formed on the substrate before forming the organic light-emitting diode layer, and then the organic light-emitting diode layer is formed on the barrier layer, wherein the barrier layer is on the side of the organic light-emitting diode layer close to the substrate.

12. The method of manufacturing an organic light-emitting diode device according to claim 10, wherein the forming a barrier layer on a side of the organic light-emitting diode layer away from the substrate or on a side of the organic light-emitting diode layer close to the substrate comprises:
    forming a material layer comprising the ultraviolet absorber and an ultraviolet reflecting agent.

13. The method of manufacturing an organic light-emitting diode device according to claim 10, wherein the forming a barrier layer on a side of the organic light-emitting diode layer away from the substrate or on a side of the organic light-emitting diode layer close to the substrate comprises:
    mixing the ultraviolet absorber and an ultraviolet reflecting agent with the organic material to form the barrier layer.

14. The method of manufacturing an organic light-emitting diode device according to claim 10, wherein the forming a barrier layer on a side of the organic light-emitting diode layer away from the substrate or on a side of the organic light-emitting diode layer close to the substrate comprises mixing the ultraviolet absorber and an ultraviolet reflecting agent with the inorganic material to form the barrier layer.

15. The method of manufacturing an organic light-emitting diode device according to claim 12, wherein the ultraviolet absorber comprises one or a combination of the following: salicylates, benzophenones, benzotriazoles, substituted acrylonitriles, triazines and hindered amines, and
    wherein the ultraviolet reflecting agent comprises one or a combination of the following: titanium dioxide, zinc oxide, talc powder, clay, calcium carbonate.

* * * * *